United States Patent [19]

Kuroda

[11] Patent Number: 4,509,078

[45] Date of Patent: Apr. 2, 1985

[54] DROPOUT COMPENSATION CIRCUIT

[75] Inventor: Kazuo Kuroda, Saitama, Japan

[73] Assignee: Pioneer Video Corporation, Yamanashi, Japan

[21] Appl. No.: 465,066

[22] Filed: Feb. 8, 1983

[30] Foreign Application Priority Data

Feb. 8, 1982 [JP] Japan .............................. 57-16087[U]

[51] Int. Cl.³ .......................... H04N 5/14; H04N 5/21
[52] U.S. Cl. ..................................... 358/160; 358/163; 358/167; 358/314; 358/336; 360/38.1
[58] Field of Search ................... 358/36, 37, 166, 167, 358/160, 163, 314, 336, 327, 340; 360/38.1

[56] References Cited

U.S. PATENT DOCUMENTS

| | | | |
|---|---|---|---|
| 3,969,759 | 7/1976 | Amery | 358/314 |
| 3,989,893 | 11/1976 | Eisema | 358/343 |
| 4,076,969 | 2/1978 | Sacks | 360/38.1 |
| 4,376,289 | 3/1983 | Reitmeier et al. | 358/314 |

*Primary Examiner*—Tommy P. Chin
*Assistant Examiner*—Michael D. Parker
*Attorney, Agent, or Firm*—Sughrue, Mion, Zinn, Macpeak and Seas

[57] ABSTRACT

A dropout compensation circuit includes a low-pass filter and sequential first and second buffer amplifiers. Between the buffer amplifiers is arranged a switch which is opened in response to dropout detection, and a capacitor for holding the input voltage. A feedback circuit is connected between the output of the second buffer amplifier and the input of the first buffer amplifier, which may include a switch or a feedback resistor.

5 Claims, 10 Drawing Figures

DROPOUT COMPENSATION CIRCUIT

BACKGROUND OF THE INVENTION

The present invention relates to an improvement in a dropout compensation circuit provided in a reproduction circuit to reproduce a signal recorded on a video tape or video disc, which compensates for a reproduction signal when dropout occurs during the reproduction of the same, that is, when the level of the reproduced signal is locally abruptly lowered.

The term "dropout" as used herein refers to a faulty portion of a detected signal, which is temporarily produced due to a defect in the information recording surface, and which lasts a brief period of time. Dropout is caused by scratches or dust on the recording medium, or the uneven quality of the information recording surface as occurs in the course of formation of the recording medium. The occurrence of dropout cannot be avoided. Dropout exerts a bad influence upon the reproduced signal and introduces unwanted noise thereinto. With respect to a video signal, the influence exerted thereupon can be reduced by using a luminance and/or chrominance signal delayed by a time corresponding to one horizontal line in place of the detected video signal where dropout occurs. However, in an audio signal which does not have a line-frequency structure, dropout compensation as is effected with the video signal is not available.

A dropout compensation technique for use with audio signals is disclosed in U.S. Pat. No. 3,989,893, according to which dropout of an audio signal being subjected to frequency modulation is compensated for prior to detection.

Another prior art technique exists which compensates for dropout of the information signal after the same is detected. FIG. 1 is a block diagram of a video disc player incorporating an information reproducing device of this kind. In the video disc player, video and audio information signals which are frequency-multiplexed are read out from a rotating video disc as optical variations or electrostatic capacitance variations by means of a pick-up 1.

The video and audio information signals read out therefrom are separated by means of band-pass filters 3 and 4 and supplied to a video demodulation circuit 5 and an audio demodulation circuit 6, respectively. The video information signal is demodulated in the demodulation circuit 5 and a composite video signal is provided therefrom, which is supplied to a video output terminal 7. On the other hand, the audio information signal is demodulated in a demodulation circuit 6. An audio signal is provided from circuit 6 which is then supplied to an audio output terminal 9 via a dropout compensation circuit 8. The dropout compensation circuit 8 receives a control signal fed from a dropout sensor 10, and thereby carries out dropout compensation when dropout occurs. Various types of dropout sensors are usable. For example, the dropout sensor may be constructed so as to sense dropout in the production of the high frequency noise component (ranging from 100 KHz to 200 KHz) derived from the audio demodulation circuit 6 or from the noise component contained in the output of the pick-up 1.

Such a dropout compensation circuit 8 is shown in FIG. 2, which circuit includes a low-pass filter 11 (having, for example, a cut-off frequency of 20 KHz) for removing an unwanted frequency component, two buffer amplifiers 12 and 13 of the voltage follower configuration, the gain of each is 1 (one), a switch 14, and a holding capacitor 15. Normally, the switch 14 is kept closed, so that the reproduction signal inputted to the low-pass filter 11 is output from the second buffer amplifier 13. In this condition, the output voltage of the low-pass filter 11 is held in the capacitor 15. When dropout occurs, the switch 14 is opened in response to the control signal fed from the dropout sensor 10 and the voltage being held in the capacitor 15 is taken from the output of the second amplifier 13 and supplied to the audio output terminal 9 while compensating for dropout. Signal waveforms at the points A, B and C of the circuit in FIG. 2 are shown in FIGS. 3A through 3C, respectively.

In this circuit, however, turbulence in the output of the low-pass filter 11 is prolonged when dropout occurs. Therefore, the holding time ($T_1$ in FIG. 3B) of the capacitor 15 must be set to be a longer time. This causes distortion in the reproduced signal because the input waveform (FIG. 3A) of the low-pass filter 11 and the output waveform (FIG. 3C) of the second buffer amplifier 13 are different from one another with a relatively large amount of deviation.

SUMMARY OF THE INVENTION

In order to eliminate the afore-mentioned drawback accompanying the prior art, the present invention provides an improved dropout compensation circuit which suppresses the turbulent waveform of the information signal caused by dropout within a brief period of time.

The dropout compensation circuit according to the invention is characterized by the clamping of the information signal upon feeding back the potential held by the holding capacitor when the waveform of the information signal is distorted by the occurrence of dropout.

DETAILED DESCRIPTION OF THE PREFERRED EMBODIMENTS

The present invention will now be described by way of its preferred embodiments with reference to the accompanying drawings.

Figure 4:
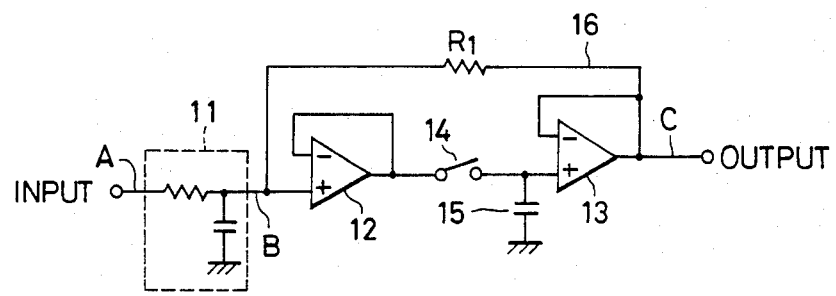
FIG. 4 is a circuit diagram illustrating one embodiment of the dropout compensation circuit according to the invention.

FIG. 4 is a circuit diagram illustrating one embodiment of the dropout compensation circuit according to the invention, in which reference numeral 11 denotes a low-pass filter coupled to the output of the demodulator 8; 12, a first buffer amplifier of the voltage follower configuration, the gain of which is 1 (one); 14, a second buffer amplifier of the voltage follower configuration, the gain of which is also 1 (one); 14, a switch which is opened when dropout occurs; 15, a holding capacitor; and $R_1$, a feedback resistor interposed between the output of the second buffer amplifier 13 and the input of the first buffer amplifier 12.

When no dropout is present in the input signal applied to the input of the low-pass filter 11, the switch 14 is kept closed and the potential at the input point B of the first buffer amplifier 12 is held equal to the potential at the output point C of the second buffer amplifier 13, and thus no current flows in the feedback resistor $R_1$. Accordingly, the input signal of the low-pass filter 11 appears at the output of the second buffer amplifier 13, while the voltage of this input signal is charged in the capacitor 15.

Figure 5A:
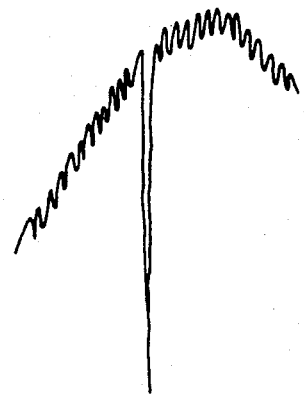
FIGS. 5A, 5B and 5C are waveform diagrams of the signals at the points A, B and C of the circuit shown in FIG. 4, respectively.
Figure 5B:
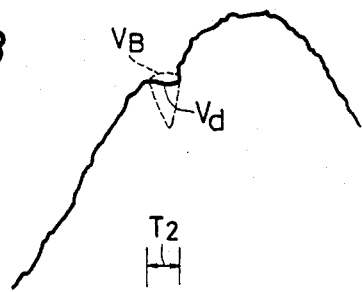
Figure 5C:
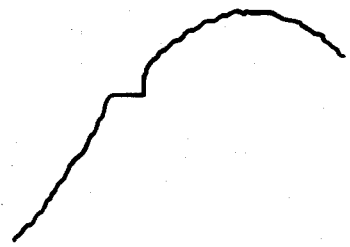

When dropout is present in the input signal (FIG. 5A) applied to the low-pass filter 11, the switch 14 is opened and the potential held in the capacitor 15 appears at the output of the second buffer amplifier 13 so as to compensate for the dropout. Furthermore, the output potential (FIG. 5C) of the second buffer amplifier 13 is fed back through the feedback resistor $R_1$ to the non-inverting input of the first buffer amplifier 12. The potential at the input point B of the first buffer amplifier 12 is determined by the potential of the input signal (FIG. 5A), whose waveform is distorted by the dropout, and the potential $V_B$ at the output point C of the second buffer amplifier 13 divided by the ratio of the feedback resistor $R_1$ and the output resistance of the low-pass filter 11. The output potential (FIG. 5B) of the low-pass filter 11 is clamped by the thus divided potential $V_d$, so that turbulence in the output waveform of the low-pass filter 11 is suppressed within a brief period of time ($T_2$ in FIG. 5B). Therefore, it is possible to deliver the input signal of the low-pass filter 11 to the output C of the second buffer amplifier 13 upon closure of the switch 14. Provided that the resistance of the switch 14 or the capacitance of the holding capacitor 15 are sufficiently small, the switch 14 and the capacitor 15 do not form a low-pass filter. It is thus possible to improve the overall circuit. In this case, the feedback resistor $R_1$ can be made quite small, so that the effect of clamping increases.

Figure 1:
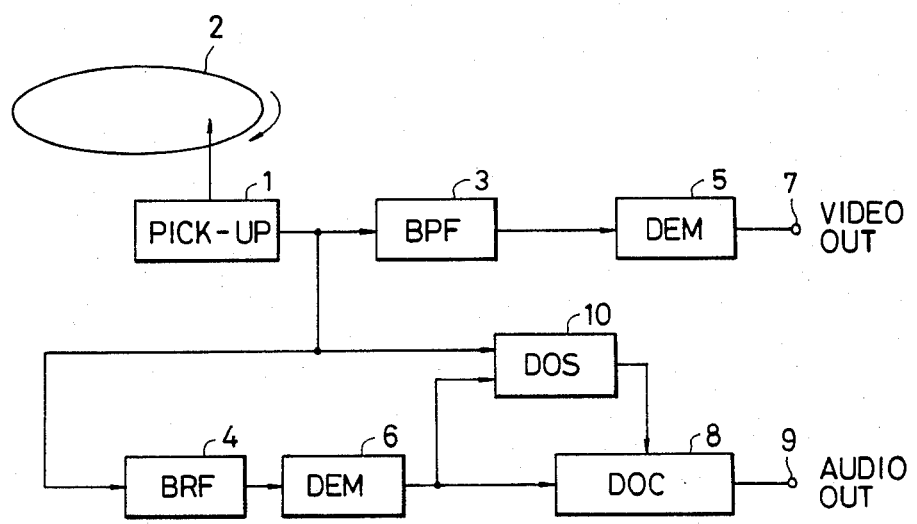
FIG. 1 is a block diagram illustrating an information reproducing device which includes a dropout compensation circuit.
Figure 2:
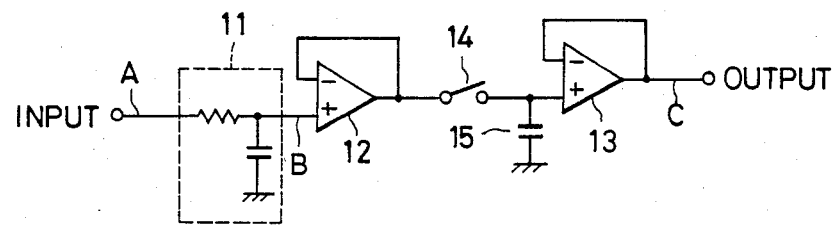
FIG. 2 is a circuit diagram illustrating a prior art dropout compensation circuit.
Figure 6:
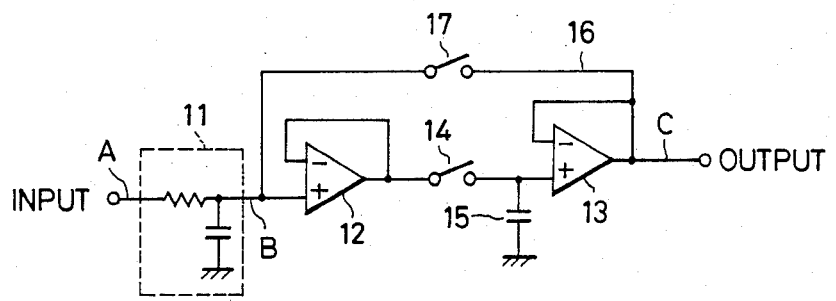
FIG. 6 is a circuit diagram illustrating another embodiment of the dropout compensation circuit according to the invention.
Figure 3A:
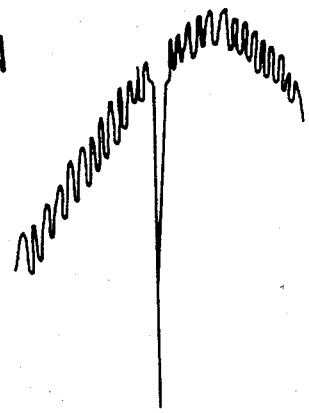
FIGS. 3A, 3B and 3C are waveform diagrams of the signals at the points A, B and C of the circuit shown in FIG. 2, respectively.
Figure 3B:
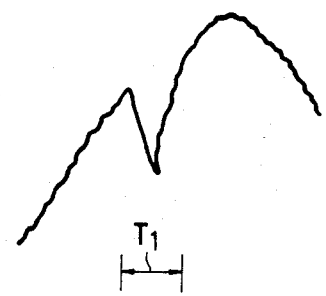
Figure 3C:
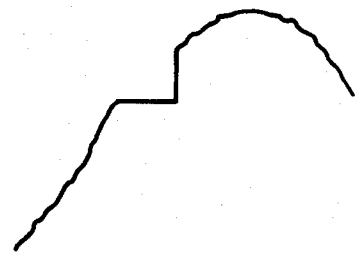

FIG. 6 is a circuit diagram illustrating another embodiment of the invention. In this embodiment, a switch 17 is interposed in lieu of the feedback resistor $R_1$ in the feedback circuit 16. When dropout occurs, the switch 14 is opened while the swich 17 of the feedback circuit 16 is closed and the output potential C of the second buffer amplifier 13 is fed back to the input of the first buffer amplifier 12, whereby the output of the low-pass filter 11 containing dropout is clamped. In FIG. 6, numerals as used in FIG. 2 denote like components. In this embodiment, the feedback resistance $R_1$ can be neglegible, so that the effect of clamping increases.

As described above, according to the invention, with the arrangement including the low-pass filter 11, the first buffer amplifier 12 coupled to the output of the filter 11 and whose gain is 1 (one), the second buffer amplifier 13 coupled to the output of the amplifier 12 and whose gain is also 1 (one), the switch 14 interposed between the amplifiers 12 and 13 and opened when dropout occurs; the holding capacitor serving to hold the input voltage of the low-pass filter 11 when the switch 14 is closed and to output a voltage to the second buffer amplifier 13 when the switch 14 is opened; and the feedback circuit 16 for feeding back the output potential of the second buffer amplifier 13 to the input of the first buffer amplifier 12, the output waveform of the low-pass filter 11 distorted by dropout is suppressed within a brief period of time by the feedback potential of the feedback circuit 16.

Although a description has been made with respect to a reproduction device for a video disc, it will be appreciated by one skilled in the art that the dropout compensation circuit of the present invention is equally applicable to other kinds of information reproduction devices.

What is claimed is:

1. A dropout compensation circuit comprising:
   a low-pass filter to which an information signal is inputted;
   a first buffer amplifier;
   a second buffer amplifier coupled to an output of said first buffer amplifier;
   a switch interposed between said first and said second buffer amplifiers, said switch being opened when dropout occurs;
   a holding capacitor for holding an input voltage of said low-pass filter when said switch is closed and for outputting the voltage held therein through said second buffer amplifier when said switch is opened; and
   a feedback circuit for feeding back the output voltage of said second buffer amplifier to the input of said first buffer amplifier.

2. A dropout compensation circuit as recited in claim 1, wherein said feedback circuit comprises a resistor.

3. A dropout compensation circuit as recited in claim 1, wherein said feedback circuit comprises a switch, said switch being normally opened, and being closed when said switch interposed between said buffer amplifiers is opened.

4. A dropout compensation circuit as recited in claim 1, wherein said feedback circuit is connected to a non-inverting input of said first buffer amplifier.

5. A dropout compensation circuit as recited in claim 1, wherein the gain of said first and second buffer amplifiers is equal to 1 (one).

* * * * *